United States Patent [19]
Hershman

[11] 4,092,725
[45] May 30, 1978

[54] ELECTRONIC TRANSFORM SYSTEM

[75] Inventor: George H. Hershman, Carlsbad, Calif.

[73] Assignee: Hughes Aircraft Company, Culver City, Calif.

[21] Appl. No.: 782,277

[22] Filed: Mar. 28, 1977

[51] Int. Cl.² ............... G06G 7/12; H03K 5/159
[52] U.S. Cl. ................... 364/826; 307/221 D; 325/42; 364/825; 364/862
[58] Field of Search ............ 235/193, 197; 307/221 D; 333/70 T, 18, 28 R; 328/167; 325/42, 65; 358/133, 138, 160; 250/211 J

[56] References Cited

U.S. PATENT DOCUMENTS

| | | | |
|---|---|---|---|
| 3,809,923 | 5/1974 | Esser | 307/221 D |
| 3,952,188 | 4/1976 | Sloate et al. | 235/193 |
| 3,953,745 | 4/1976 | Bailey | 333/70 T X |
| 3,983,408 | 9/1976 | Adam et al. | 307/221 D |
| 3,999,152 | 12/1976 | Sato et al. | 333/70 T |
| 4,011,441 | 3/1977 | Michon et al. | 235/193 |

*Primary Examiner*—Joseph F. Ruggiero
*Attorney, Agent, or Firm*—Martin E. Gerry; W. H. MacAllister

[57] ABSTRACT

An electronic system providing discrete mathematical transforms includes a charge-coupled transversal filter, a pair of sample and hold circuits connected to the output of the filter, and a differential amplifier connected to the outputs of the pair of sample and hold circuits. An analog-to-digital converter is connected to the output of the differential amplifier. A transmitter of intelligence is connected to the output of the analog-to-digital converter for sending compressed intelligence via a data link.

18 Claims, 4 Drawing Figures

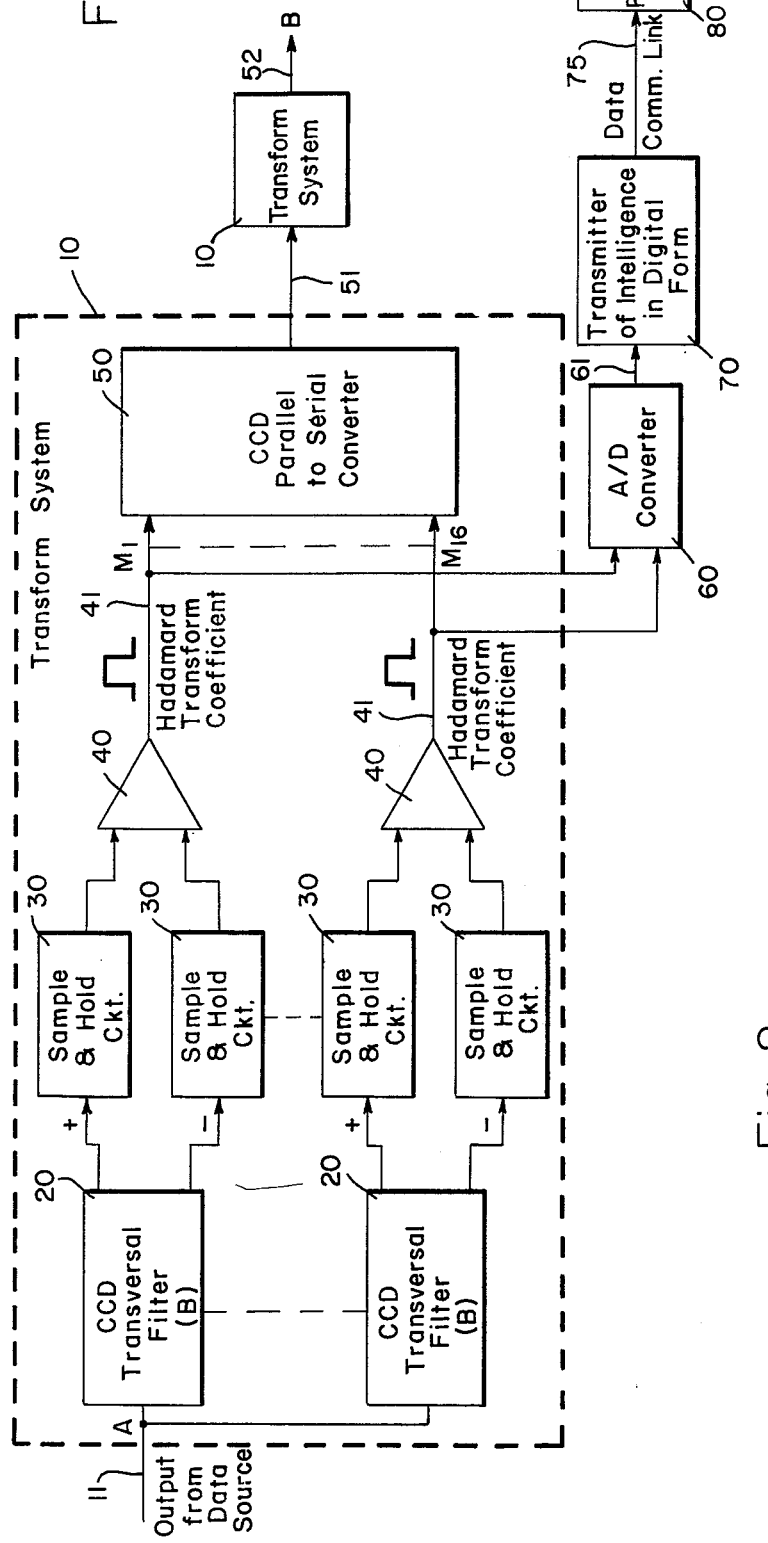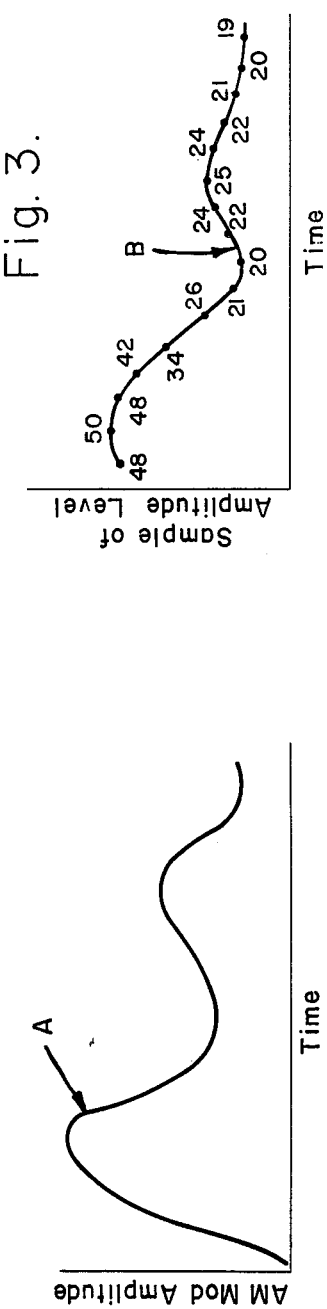

ELECTRONIC TRANSFORM SYSTEM

BACKGROUND OF THE INVENTION

This invention is in the field of mathematical transform mechanization, and particularly in the area of mechanization of direct and inverse Hadamard, cosine and sine transforms.

No prior art appears to exist wherein the mechanization is provided by utilizing charge-coupled transversal filters, pairs of sample and hold circuits and differential amplifiers processing the outputs of the sample and hold circuits.

SUMMARY OF THE INVENTION

An electronic system for providing discrete mathematical transforms, comprises the combination of a charge-coupled transversal filter, a pair of sample and hold circuits connected to the output of the filter, and a differential amplifier connected to the outputs of the pair of sample and hold circuits.

An analog-to-digital converter is connected to the output of the differential amplifier. A transmitter of digital intelligence is connected to the output of the analog-to-digital converter. A receiver may be electromagnetically coupled to the transmitter via a data link. A digital-ao-analog converter may be connected to the output of the receiver. Means connected to the output of the digital-to-analog converter are provided for converting a direct transform of intelligence as a function of time.

The invention may be alternatively described as a method for electronically providing discrete mathematical transforms, by generating a signal comprising a carrier modulated by intelligence, sampling the generated signal and providing at least one set of summed intelligence components, selecting a predetermined portion of each of said at least one set of summed intelligence, and sensing the difference between two selected portions of each of said at least one set of summed intelligence.

Additionally, functions performed include switching said difference so that each portion of said at least one set of summed intelligence is provided in serial outputs, and transforming the serial outputs into the time domain thereby providing the inverse transforms of said at least one set of summed intelligence.

Such invention provides a direct Hadamard transform. Also provided by the same equipment is a direct cosine transform and/or a direct sine transform, as well as inverse transforms thereof.

BRIEF DESCRIPTION OF THE DRAWINGS

FIG. 1 is a system schematic in accordance with the invention.

FIG. 2 shows one-half of an amplitude modulated signal to be sampled and transformed by the system of FIG. 1.

FIG. 3 shows a plurality of samples taken at a number of discrete locations of the modulation envelope of FIG. 2.

DETAILED DESCRIPTION

Figure 4:
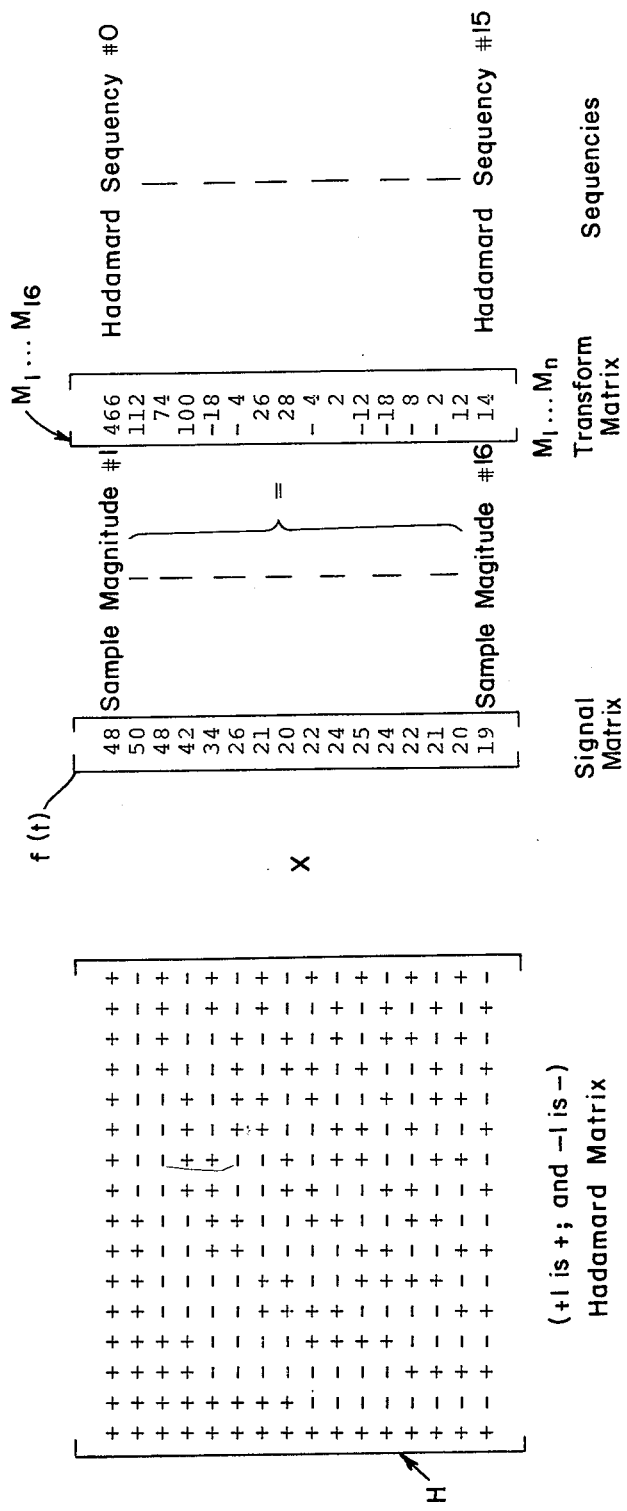
FIG. 4 shows the method of mathematically performing matrix multiplication to obtain Hadamard sequencies of sampled information taken as in FIG. 3 and mechanizing same by the equipment of FIG. 1.

Referring to the drawings, Hadamard transform system 10 is mechanized in FIG. 1, utilizing charge-coupled circuits. This system has the capability of not only converting an amplitude modulated carrier having intelligence components therein, but also providing the inverse transforms by utilizing another transform system 10 in series with a first transform system to restore the intelligence to the time domain as inputted at 11.

Hence output from a data source, such as a video camera, can provide AM modulated series of pulses at 11, a typical one-half of a modulation envelope being shown in FIG. 2 at A, showing a carrier contour of the pulse intelligence therein.

The modulation envelope is fed to a plurality of CCD transversal filters 20, which in this example takes 16 samples of the analog AM data at B, as illustrated by FIG. 3. The numerical values shown on curve B illustrates the typical relative amplitudes of each of the 16 samples taken.

Therefore, each filter 20 receives all the 16 samples in their time sequenced order as shown in FIG. 3. Filter 20 comprises a shift register type structure, so that the first of the 16 samples is registered in a first location in the filter. When the second sample comes along, it shifts the first sample to a second position of the register, the second sample being registered in the first location. This process continues until all 16 samples are loaded in the register. Then, at a subsequent time period following the loading of the 16 samples, all such samples are fed into the sample and hold circuits simultaneously and in parallel as below described.

CCD transversal filters are known in the art, examples of which may be found in the textbook entitled Charge Transfer Devices by Sequin and Tompsett, pages 216–231, copyright 1975, published by Academic Press, New York.

Although only two channels, duplicate of each other, are illustrated, it is to be understood that multiple channels are required, each to handle one Hadamard coefficient.

Each of filters 20 will have + and −bus outputs that connect each filter to a sample and hold circuit 30. The filter which provides the lowest order Hadamard coefficient of the transformation, denoted by sequency zero, has all its taps, in this case 16 taps for each of the 16 samples taken, connected to the +bus. Hence, the transform coefficient resulting represents the sum of all samples and corresponds to the DC level of all samples or average value of the 16 analog samples. All other filters, representing sequencies 1-15, have 8 taps or outputs from filters 20 connected to the +bus and 8 taps or outputs connected to the −bus. The order of output connections from filter 20 is dependent on the particular sequency processed.

Sample and hold circuits 30 are known in the art and may be found in a textbook entitled Mossfet in Circuit Design by Crawford, pages 108-109, published by McGraw-Hill, New York, Copyright 1967.

Thus, the + and −bus inputs to each of a respective sample and hold circuit 30, results in the sampled data as at B to be fed to and again sampled by circuits 30 which feed their output samples into a differential amplifier 40, which amplifier 40 takes the difference between the samples from each of the circuit 30 pair outputs, and provides a Hadamard transform coefficient in a pulse output form, the amplitude of which varies in accordance with the difference between the + and − bus bar outputs. These coefficients are designated as $M_1 \ldots M_{16}$ representing 16 sequencies of the direct Hadamard transform.

Such Hadamard coefficients, of differing pulse amplitudes, are fed into a CCD parallel to serial converter for enabling the coefficients in terms of $M_1 \ldots M_{16}$ to be passed therethrough in the order in which the input intelligence at A appears at 11.

The complete direct Hadamard transform will therefore appear at 51 at the output of converter 50.

Such complete Hadamard transform is reflected by and represented in its mathematical matrix counterpart as shown in FIG. 4, wherein the direct Hadamard transform is defined as:

$$F(u) = H \times f(t)$$

wherein H is the Hadamard matrix represented by + and − symbols which indicate +1 and −1 logic levels, $f(t)$ matrix represent the relative amplitudes of the 16 samples of analog data as at B in FIG. 3. $M_1 \ldots M_{16}$ is a matrix representing the Hadamard coefficients available as inputs into converter 50 to provide Hadamard sequencies 0, 1, . . . 15 at 51 representing the complete direct Hadamard transform of the particular case illustrated in in FIG. 4.

The complete matrix multiplication is arrived at by multiplying the first element in the first row of H by the first element in $f(t)$ which is 48. Then the second element of the first row of H is multiplied by the second element in $f(t)$ which is 50 and so on until all elements in the first row of H have been multiplied by the elements in $f(t)$. These resultant products are algebraically summed to provide the first Hadamard coefficient $M_1$ which is +466. The process is repeated with the second row et seq. of H multiplied by $f(t)$ to obtain the second Hadamard coefficient −112. This process is repeated until all rows of H have been multiplied by $f(t)$ and all Hadamard coefficients are computed.

It is noted that CCD parallel to serial converter at 50 may be found in the same textbook above mentioned entitled Charge Transfer Devices at pages 207–209. Though showing a CCD converter at 50, a conventional parallel to serial electronic converter may be used.

It should also be noted that differential amplifier 40 is known in the art and may be found in the textbook entitled MOS/LSI Design and Application, by Carr and Mize, pages 291–293, published by McGraw-Hill, New York, copyright 1972.

To obtain transformation of the 16 Hadamard sequencies back to the time domain which is the inverse transform, another system as at 10 may be used being connected to output 51. The output of the second system 10 at 52 will provide the inverse transformation of the intelligence received from the original data source at 11 to intelligence components shown in curve B as a function of time.

The circuit above may be utilized in a data transmission link to rapidly send data which has been compressed by Hadamard transformation to a receiver and then reconverted to original intelligence as a function of time.

Such system therefore may employ an analog-to-digital converter at 60 connected to each of the plurality of outputs from differential amplifiers 40 which converts the analog parallel inputs to serial digital signals. The digital outputs from converter 40 are fed into a transmitter 70 capable of transmitting modulated intelligence in digital format, to enable the compressed data to be fed into either a land line or electromagnetic radiation data link at 75 which link is coupled to a receiver that demodulates the carrier signal and passes the intelligence signals of the digital pulse information to a digital-to-analog converter 90. Converter 90 changes the digital data into analog information which may then be fed into system 10 to provide the Hadamard sequencies via such communication link as at B.

Each differential amplifier output at 41 provides an individual Hadamard coefficient which is part of the direct Hadamard transform. Hence, at 41 the Hadamard coefficients are provided in parallel, one from each differential amplifier output, as inputs to the parallel to serial converter 50. Therefore at 51, the output of converter 50, there will be provided the Hadamard coefficients in serial format and in predetermined sequence.

Accordingly, by passing the serially formatted Hadamard coefficients through a like subsystem 10, the analog curve B is re-established at 52, at the output of the second subsystem 10.

The branch consisting of circuits 60, 70, 80, 90 and 10, is fed by differential amplifiers 40 thereby providing such branch the same Hadamard coefficients at 41 as inputs to analog-to-digital converter 60. Hence, the Hadamard coefficients at 61 are in digital format feeding transmitter 70, as above discussed. Hence, after processing the received signals by receiver 80, the Hadamard coefficients in digital form are fed into a like subsystem 10 to reconvert from direct transform format to inverse Hadamard transform format to likewise reconstruct the analog sampled data as at B.

The discussion above related to mechanization of a Hadamard transform and its inverse transform. It is pointed out though that intelligence in either cosine transform of sine transform can be processed by the same equipment detailed in FIG. 1 in similar manner as described in connection therewith for the Hadamard transform and its inverse transform to reconvert same to the time domain.

What is claimed is:

1. An electronic system for providing discrete mathematical transforms, comprising the combination:
    a charge-coupled transversal filter;
    a pair of sample and hold circuits connected to the output of the filter;
    a differential amplifier connected to the output of the pair of sample and hold circuits; and
    an analog-to-digital converter connected to the output of the differential amplifier.

2. The invention as stated in claim 1, including a transmitter of digital intelligence connected to the output of the analog-to-digital converter.

3. The invention as stated in claim 2, including a receiver electromagnetically coupled to the transmitter.

4. The invention as stated in claim 3, including a digital-to-analog converter connected to the output of the receiver.

5. The invention as stated in claim 4, including means connected to the output of the digital-to-analog converter for converting a direct transform to intelligence as a function of time.

6. An electronic system for providing mathematical transforms, comprising the combination:
    a plural number of charge-coupled transversal filters;

a plural number of pairs of sample and hold circuits connected to the filters, one filter per each corresponding pair of sample and hold circuit;

a plural number of differential amplifiers, connected to the plural number of pairs of sample and hold circuits, one pair of said circuits per each corresponding amplifer; and an electronic parallel-to-serial converter connected to the outputs of the differential amplifiers.

7. The invention as stated in claim 6, including means connected to the output of the parallel-to-serial converter for inverse transforming data inputted thereto into the time domain.

8. The invention as stated in claim 6, including an analog-to-digital converter connected to the outputs of the differential amplifiers.

9. The invention as stated in claim 8, including a transmitter of digital intelligence connected to the output of the analog-to-digital converter.

10. The invention as stated in claim 9, including a receiver electromagnetically coupled to the transmitter.

11. The invention as stated in claim 10, including a digital-to-analog converter connected to the output of the receiver.

12. The invention as stated in claim 11, including means connected to the output of the digital-to-analog converter for providing intelligence output therefrom as a function of time.

13. A method for electronically providing discrete mathematical transforms, comprising in combination the steps of:
   (a) generating a signal comprising a carrier modulated by intelligence;
   (b) sampling the generated signal and providing at least one set of summed intelligence components;
   (c) selecting a predetermined portion of each of said at least one set of summed intelligence; and
   (d) sensing the difference between two selected portions of each of said at least one set of summed intelligence.

14. The invention as stated in claim 13, including the further step of:
   (e) switching said difference so that each portion of said at least one set of summed intelligence is provided in serial outputs.

15. The invention as stated in claim 14, including the further step of:
   (f) transforming the serial outputs of step (e) into the time domain thereby providing the inverse transforms of said at least one set of summed intelligence.

16. The invention as stated in claim 14, wherein step (e) provides a direct Hadamard transform.

17. The invention as stated in claim 14, wherein step (e) provides a direct cosine transform.

18. The invention as stated in claim 14, wherein step (e) provides a direct sine transform.

* * * * *